(12) United States Patent
Lerche et al.

(10) Patent No.: US 10,605,931 B2
(45) Date of Patent: Mar. 31, 2020

(54) SIPM SENSOR CHIP

(71) Applicant: Forschungszentrum Juelich GmbH, Juelich (DE)

(72) Inventors: Christoph Lerche, Herzogenrath (DE); Arne Berneking, Karlsruhe (DE); Joni Nadim Shah, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 145 days.

(21) Appl. No.: 15/776,843

(22) PCT Filed: Dec. 2, 2016

(86) PCT No.: PCT/DE2016/000428
§ 371 (c)(1),
(2) Date: May 17, 2018

(87) PCT Pub. No.: WO2017/108018
PCT Pub. Date: Jun. 29, 2017

(65) Prior Publication Data
US 2018/0329085 A1    Nov. 15, 2018

(30) Foreign Application Priority Data

Dec. 21, 2015  (DE) .................. 10 2015 016 471
May 19, 2016  (DE) .................. 10 2016 006 056

(51) Int. Cl.
*G01T 1/20*    (2006.01)
*G01T 1/24*    (2006.01)
(Continued)

(52) U.S. Cl.
CPC ............ *G01T 1/248* (2013.01); *G01T 1/1647* (2013.01); *G01T 1/208* (2013.01); *H01L 27/14643* (2013.01)

(58) Field of Classification Search
CPC ....... G01T 1/248; G01T 1/1647; G01T 1/208; H01L 17/14643
See application file for complete search history.

(56) References Cited

U.S. PATENT DOCUMENTS 7,476,864 B2   1/2009  Benlloch Baviera et al.
10,357,214 B2 * 7/2019  Kimura .................... A61B 6/42
(Continued)

FOREIGN PATENT DOCUMENTS

EP    2495585 A2      9/2012
WO    2015-063704 A1 * 5/2015 ............. G01T 1/248

OTHER PUBLICATIONS

Gola et al., "A novel approach to position-sensitive silicon photomultipliers: First Results," 2013 IEEE Nuclear Science Symposium and Medical Imaging Conference, 4 pages. (Year: 2013).*
(Continued)

*Primary Examiner* — Kiho Kim
(74) *Attorney, Agent, or Firm* — Leydig, Voit & Mayer, Ltd.

(57) ABSTRACT

A SiPM sensor chip with a plurality of pixels includes a photodiode; a quench resistor; and a current divider configured to divide the photocurrent of the photodiodes into two currents of equal size. The current divider Sq,nm or Snm lead to networks NS,h,n and NS,V,m, each of which leads to additional current dividers Sh,n and Sv m having coding resistors Rh,A,n and Rh,B,n, and Rv,c,m and Rv D m, which are linearly coded and which lead to output channels A, B, C, D, with these sensor features being integrated into the sensor chip. The networks Ns,h,n and/or NSiVlm each lead to a summation network Oh and/or Ov, in which the signals of the networks Ns,h,n and/or NS,v,m are merged via summation resistors Rs,h,n and Rs,v,m, respectively, and lead to the output channels E and/or F.

12 Claims, 6 Drawing Sheets

(51) Int. Cl.
  *G01T 1/208* (2006.01)
  *G01T 1/164* (2006.01)
  *H01L 27/146* (2006.01)

(56) References Cited

U.S. PATENT DOCUMENTS

2016/0274251 A1* 9/2016 Kimura .................. G01T 1/208
2018/0374978 A1* 12/2018 Piemonte .............. H01L 31/107

OTHER PUBLICATIONS

Arne Berneking, "Characterization of Sensitivity encoded Silicon Photomultiplier for high resolution simultaneous PET/MR Imaging", Diploma Thesis, RWTH Aachen University, Dec. 3, 2012, pp. 1-161.
A. Gola, et al., "A Novel Approach to Position-Sensitive Silicon Photomultipliers: First Results", *2013 IEEE Nuclear Science Symposium and Medical Imaging Conference (2013 NSS/MIC)*, Oct. 27-Nov. 2, 2018, pp. 1-4.
Volkmar Schulz, et al., Sensitivity encoded silicon photomultiplier-a new sensor for high-resolution PET-MRI, Phys. Med. Biol. 58 (2013), Jun. 20, 2013, pp. 4733-4748.
P. Fischer, et al., "Interpolating Silicon Photomultipliers", NIMPRA, Nov. 2012, pp. 1-13.
Samuel España, et al., "DigiPET: sub-millimeter spatial resolution small-animal PET imaging using thin monolithic scintillators", Phys. Med. Biol. 59 (2014), Jun. 3, 2014, pp. 3405-3420.
Ch. W. Lerche, et al., "Nuclear Instruments and Methods in Physics Research A, Nuclear Instuments and Methods in Physics Research A 600 (2009), Dec. 25, 2008.
Mikiko Ito, et al., "Positron Emission Tomography (PET) Detectors with Depth-of-Interactio (DOI) Capability", Biomed Eng Lett (2011) 1, May 16, 2011, pp. 70-81.
Martin S. Judenhofer, et al., "Simultaneous PET-MRI: a new approach for functional and morphological imaging, Nature Medicine, vol. 14, No. 4, Apr. 2008, pp. 459-465.
Sibylle I. Ziegler, et al., "A prototype high-resolution animal positron tomograph with avalanche photodiode arrays and LSO crystals, European Journal of Nuclear Medicine vol. 28, No. 2, Feb. 2001, pp. 136-143.
Marcin Balcerzyk, et al., "Preliminary performance evaluation of a high resolution small animal PET scanner with monolithic crystals and depth-of-interaction encoding", *2008 8th IEEE International Conference on BioInformatics and BioEngineering*, Oct. 8-10, 2008, pp. 1-4.
Marcin Balcerzyk, et al., "Initial performance evaluation of a high resolution Albira small animal ppositron emission tomography scanner with monolithic crystals and depth-of-interaction encoding from a user's perspective", Meas. Sci. Technol. 20 (2009), May 21, 2009, pp. 1-7.
A.J. González Martínez, et al., "Innovative PET detector concept based on SiPMs and continuous crystals", Nuclear Instruments and Methods in Physics Research A 695 (2012), Nov. 20, 2011, pp. 213-217.
Stefan Siegel, et al., "Simple Charge Division Readouts for Imaging Scintillator Arrays using a Multi-Channel PMT", IEEE Transactions on Nuclear Science, vol. 43, No. 3, Jun. 1996, pp. 1634-1641.
David P. McElroy, et al., "First Results From MADPET-II: A Novel Detector and Readout System for High Resolution Small Animal PET", *2003 IEEE Nuclear Science Symposium. Conference Record* (IEEE Cat. No. 03CH37515), Oct. 19-25, 2003, pp. 2043-2047.
Ferri Alessandro et al: "Characterization of Linearly Graded Position-Sensitive Silicon Photomultipliers", IEEE Transactions on Nuclear Science, IEEE Service Center, New York, NY, US, vol. 62, No. 3, Jun. 1, 2015 (Jun. 1, 2015), pp. 688-693, XP011584227.

* cited by examiner

SIPM SENSOR CHIP

CROSS REFERENCE TO RELATED APPLICATIONS

This application is a U.S. National Stage Application under 35 U.S.C. § 371 of International Application No. PCT/DE2016/000428 filed on Dec. 2, 2016, and claims benefit to German Patent Applications Nos. DE 10 2015 016 471.6 filed on Dec. 21, 2015, and DE 10 2016 006 056.5 filed on May 19, 2016. The International Application was published in German on Jun. 29, 2017 as WO 2017/108018 A1 under PCT Article 21(2).

FIELD

The invention relates to a sensor chip that is suitable for a positron-emission topography detector ring.

BACKGROUND

According to the prior art, positron-emission topography detector rings are used in order to detect $\beta^+\beta^-$ annihilation radiation. The rings are composed of scintillation crystals adjoined by sensors that are capable of detecting scintillation radiation. Typical detectors are SiPMs (silicon photomultipliers). The construction is such that the detector ring is generally circular and the object to be measured—such as a human or animal patient's body part, for example—is placed in the center of the detector ring (PET ring). $\beta^+\beta^-$ annihilation radiation is produced through the use of radiodiagnostics, and that radiation is to be detected. The $\beta^+\beta^-$ annihilation radiation, hereinafter called annihilation radiation, strikes scintillation crystals that are arranged in the manner of a ring around the object to be studied and produces the scintillation radiation. The scintillation radiation, in turn, is registered by the SiPM, which is located in the concentric arrangement behind the scintillation crystal in relation to the radiation source. However, the SiPMs can also be arranged on other sides of the scintillation crystal—in front of the scintillation crystal or to the side thereof, for example. The scintillation crystal is a three-dimensional body. In relation to an arrangement in which the object to be studied emits annihilation radiation from the center of the detector ring, the cross section upon which the annihilation radiation is incident on the scintillation crystal corresponds an xy axis. The depth of the scintillation crystal is referred to in this nomenclature as the z axis. In an idealized representation, an object to be studied or an emission source for radiating an energy of 511 keV, which ideally strikes the xy plane of the scintillation crystal perpendicularly and has a depth of penetration along the z axis of the scintillation crystal, is located in the center of the detector ring. The 511 keV annihilation radiation then triggers scintillation at a point of the scintillation crystal along the z axis that is registered by the sensor—an SiPM, for example—as a signal. An SiPM is even capable of detecting individual photons. When the minimum required light strikes the active sensor surface, the SiPM microcell experiences diode breakdown. This generates a current pulse, which can be measured at the output of the component. A so-called quench resistor prevents the cell from generating a critical current that is so high that the component is destroyed. The output current of an SiPM microcell is independent of the quantity of light that reached the sensor and started the breakdown process. An SiPM microcell is a binary sensor that detects whether or not light is incident. In order to obtain quantitative information about the incident light, an SiPM is composed of a plurality of microcells. A microcell consists of a photodiode and a quench resistor. The number of broken-down cells then provides information about the quantity of incident light.

A correlation exists between the sensitivity of the scintillation crystal and the length thereof along the z axis. The deeper the dimensioning of the scintillation crystal, the more sensitive it is, since the occurrence of a scintillation event becomes all the more likely. During the detection of the annihilation radiation, beams are emitted in two opposite directions from the point at which the annihilation radiation is emitted, so that the beams form a 180° angle. The line that is formed by these beams is referred to as the "line of response" (LOR). Accordingly, in the case of a ring-shaped detector, two beams strike scintillation crystals along the LOR that lie on opposing sides with respect to the ring-shaped arrangement, in the center of which the emission source is located.

For detectors with light detection by means of photodiodes in the form of SiPMs on only one side of the scintillation crystal, various established methods exist for determining the x and y position of an event. However, these do not include the z position, so the exact position in the scintillation crystal where the gamma photon was stopped on the z axis and converted into light is not determined. If the z position is not determined, parallax errors occur in the determination of the LOR that can be attributed to the so-called depth-of-interaction (DOI) problem. The DOI problem always arises when the point from which the emission of the annihilation radiation emanates does not lie exactly in the center of a ring-shaped detector. The farther the emission center for an LOR lies outside of the center of a PET ring, the greater the problem becomes. As a result, when a PET ring is designed, a compromise is made between an increase in sensitivity through longer scintillation crystals and a reduction in DOI errors through shorter scintillation crystals. In some areas of the PET application, the need exists to use PET rings (detector rings) that lie closely against the object of study. That is the case in medicine, in particular, if patients are to be examined simultaneously using an MRT method and a PET method. In that case, the PET ring must fit into the opening of the MRT scanner tube. One consequence of this is that the PET ring that is used must have a small diameter in order to fit into the opening of the MRT ring. However, if the dimensions of the PET ring are small, the problem arises that, while the object to be studied, such as a body part of a small animal or also of a human being, can be arranged so as to be centered, its dimensions will extend in relation to the diameter of the PET ring so as to reach far into the edge regions of the opening of the PET ring. This means, however, that points from which annihilation radiation emanates are also positioned so close to the PET ring that the DOI problem becomes substantial.

In previous years, the use of pixelated scintillation crystal blocks with smaller and smaller pixel sizes has resulted above all in a substantial improvement in the resolution in PET scanners for small animals. Pixeling is thus achieved on the xy plane, so that tubes of pixels that are aligned in the z direction form in the scintillation crystal. This was stimulated particularly by the need for higher and higher spatial resolution in PET scanners for small animals, since the object being examined is very small. Meanwhile, pixel size has already reached the sub-millimeter range. For this reason, two problems are arising more and more that must be resolved. Firstly, the pixelated crystal blocks are made of adhesive and reflector film, which is located between the individual scintillation crystals, in order to construct the pixelated block. The layer of adhesive and reflector film has an approximate thickness of 70 µm. Consequently, pixelated arrays with an especially small pixel pitch suffer increased loss of sensitivity. In the case of an array with crystal pixels measuring 0.8 cm×0.8 cm, such as those used in [1], for example, the ratio of adhesive and film to scintillation crystal decreases substantially, so that adhesive and film already make up a proportion of 29%. The proportion of scintillation crystal is logically reduced to 71%. No gamma quanta can be stopped and converted into light in the other 29% of the volume. If even smaller pixelated arrays measuring 0.5 cm×0.5 cm are used, for example, the proportion of crystal is even reduced to 59%. With pixelated arrays, an increase in resolution is therefore always associated with a loss of sensitivity. The second problem with pixelated scintillation crystal arrays is that the emitted light is concentrated on a smaller region of the SiPM detector surface. An SiPM consists of a plurality of microcells that act as binary elements. They identify whether or not light has been detected. If light has been detected, the microcell carries out a breakdown. The number of broken-down microcells indicates quantitatively how much light has reached the detector surface. If two or more light quanta trigger a microcell, the output signal remains the same. The more light is incident on an SiPM, the greater the likelihood that two or more light quanta will strike the same microcell of the SiPM. These additional light quanta then cannot be detected. Consequently, the likelihood of the saturation of a microcell is substantially greater if pixelated scintillation crystal arrays are used, since these concentrate the light more strongly on a small region of the sensor. Saturation effects also result in poorer energy resolution of the detectors.

As mentioned at the outset, detectors from the prior art use SiPM-based sensor technologies in order to enable magnetic resonance tomography (MRI) compatibility for use in MR/PET hybrid scanners. Another problem with hybrid scanners is that the space for PET detectors and associated electronics is limited by the tube diameter of the magnetic resonance tomograph (MRT). This applies particularly to ultra-high field tomographs. As a consequence of the narrower tube diameter, the PET scintillation crystals must be as short as possible. Shorter scintillation crystals also reduce the sensitivity. This also means that, due to the constraints of the tube diameter, the PET ring is located closer to the object of study. The closer the annihilations and hence the resulting LOR take place to the PET ring, the greater the parallax error. This is because the gamma quanta are no longer perpendicularly incident into the scintillation crystals if the annihilation occurs near the PET ring. With respect to PET ring design, this means that the parallax errors increase and become more pronounced when the PET ring is located close to the object to be studied, since annihilations can also take place near the PET ring in that case. Irrespective of limitations posed by hybrid devices, one also aims to design the PET rings so as to be as narrow as possible for the sake of greater sensitivity and lower costs.

Furthermore, it is known that many SiPM sensor concepts include the encoding of the output channels, since the power consumption of the PET ring is increased by an increase in output channels. However, this is limited by construction-related aspects. A simple calculation makes this clear. A PET ring with a diameter of 8 cm and a length of 10 cm results in a detector surface of 251 cm². If a 1-to-1 coupling of scintillation crystals and SiPMs with a crystal pixel size of 0.8 mm is used, 39,270 readout channels are already required if each channel is to be read out individually.

In order to achieve greater spatial resolutions, current sensor designs consist of sensor chips with narrower pixel sizes. This results in a substantial increase in readout channels, which are limited by the power consumption, space, and data rates. Consequently, position-sensitive (PS) encoding methods have been developed in order to reduce the number of readout channels of a chip [1-3, 15]. The most current concept to be developed is called PS-SSPM [1] and is based on charge-sharing PS-SiPMs. Charge-sharing PS-SiPM microcells detect light like conventional SiPM microcells. However, this sensor design includes a resistor network that distributes the generated charge as a function of the position and the coding. The detector construction presented in [1] consists of a pixelated crystal array with a pitch of 0.8 mm.

This most up-to-date detector concept enables the advantage of a reduction in output channels through the channel coding to be achieved simultaneously with a high detector array resolution, which is achieved through the use of pixelated scintillation crystal arrays with a pitch of less than one millimeter. However, it does not include any DOI information detection.

One concept published in [4] proves that it is possible to construct a PET detector consisting of monolithic crystals and SiPMs. As mentioned previously, monolithic crystals solve the problem of losses of sensitivity due to the space requirement of reflector films and associated adhesives. Moreover, the production costs of monolithic crystals are lower as a result. The thickness that is used for the crystals is 2 mm. Parallax errors are thus prevented with the construction used in [4], but that comes at the price of the small extension of the scintillation crystal in the z direction. At the same time, the detection efficiency is low as a result of the low crystal height.

There are various possibilities for measuring DOI information and thus correcting parallax errors, which also detect light on another crystal side. Particularly for SiPMs of the prior art, this increases the costs immensely. One concept for DOI detection that detects light on only one crystal side and uses monolithic crystals is published in [5] and patented in [6]. It makes use of the known principle that the light distribution of the crystal is dependent on the DOI. The detector concept that is used is coupled with monolithic crystals to H8500 position-sensitive photomultipliers (PMTs) by Hamamatsu. Moreover, a resistor network is used that enables position encoding and thus also a reduction in output channels. The standard deviation of the light distribution is used in order to estimate the DOI. In order to calculate the standard deviation, the first- and second-order moment of the light distribution is needed. The first-order moment is already given by the linear coding of the output channels. A summation network has been developed and integrated into the resistor network in order to determine the second-order moment.

A summary overview of PET detectors with DOI detection is provided in [7]. Descriptions and results of PET- and MR/PET hybrid scanners for small animals that have been developed in recent years can be found in [8-11].

Detector concepts that are based on current SiPM-based technology and include position coding for channel reduction do not include any DOI detection. For this reason, PET rings that are constructed with these detectors include parallax errors in the reconstruction. What is more, most of them use pixelated crystal arrays. As described above, this results in a loss of sensitivity caused by the reflector film and the adhesive between the crystals of the array. Due to the lack of DOI information, the thickness of the crystals is limited. An increase in sensitivity by means of thicker crystals is accompanied by a loss in spatial resolution caused by the lack of DOI information. The DOI concepts for pixelated crystals cited in [7] cannot be used with crystals of arbitrarily small size and do not work for crystal arrays with crystal sizes of 0.8 mm or 0.5 mm. The main problem with the lack of DOI detection is that the PET ring size is limited, and a narrower ring would reduce the spatial resolution.

The detector described in [4] is embodied with monolithic crystals. A closely adjoining ring was designed in order to increase the sensitivity. At the same time, monolithic crystals were used. Due to the resulting short distance between the scintillation crystals and the object of study, the DOI problem is exacerbated. Consequently, the developers of the ring are limited to a 2 mm crystal thickness. This has the consequence that the sensitivity that is gained by the narrow ring and the use of monolithic crystals is lost again as a result of the small thickness of the scintillation crystals. That having been said, that work demonstrates that a high resolution is possible with monolithic crystals.

DOI positions with SiPM-based detectors can be determined by mounting sensors on two crystal faces. This requires twice the SiPM sensor surface. At present, SiPM sensors are one of the most expensive components of a PET ring.

Methods that measure DOI information are currently not yet implemented with SiPMs on only one crystal side of a monolithic crystal. The concept that is implemented in [5, 6] uses position-sensitive PMTs that cannot be used in strong magnetic fields. They are therefore not MRT-compatible. The concept could be implemented with MRT-compatible avalanche photodiodes (APDs), which has not yet been done to date. APDs are photodiodes that undergo an avalanche effect in which photoelectrons generated by light are accelerated and activate more electrons. The resulting photocurrent depends on the light intensity, as is the case with PMTs. Nevertheless, the implementation of this concept at the level of SiPM microcells poses another challenge, since SiPM microcells are binary sensors and are operated in a different mode, the so-called Geiger mode.

A three-dimensional animal PET scanner was integrated by Judenhofer et al. [8] into a 7 T animal scanner. It is based on APDs that use scintillation crystals with a thickness of 4.5 mm and consisting of crystal arrays with 144 crystals having a pitch of 1.6 mm. The crystal array is coupled with a 3×3-sized APD array. The axial field of view (FOV) is 19 mm. This developed system shows that space is very limited, especially for integrated systems, which forces a compromise between crystal thickness and axial FOV. This results in the system's low sensitivity of 0.23%. Moreover, the DOI problem limits the crystal thickness here, too.

The first version of another prototype scanner that was made public under the name MADPET was developed in Munich [9]. It is made with APDs that have been coupled directly with 3.7 mm×3.7 mm×12 mm crystals. This prototype scanner exhibits the problem of an increase in readout channels when using 1-to-1 coupling. In the first scanner, it is not possible to read all channels at the same time. What is more, the scanner has the problem of low sensitivity. In a second version of the scanner, MADPET II, this problem was solved, and it is possible to read out all of the APDs [14]. The second version also has a two-layered readout system with two layers of crystals with interposed APDs. Since the crystals are therefore partitioned, DOI positions can also be determined. However, twice the amount of sensor surface is also required, which raises the number of readout channels again. Moreover, the approximately doubled quantity of sensors results in higher costs.

The possibility of DOI detection with position-sensitive PMTs was established in [10, 11].

Research findings with detectors consisting of SiPMs and monolithic crystals are published in [12]. In this approach, SiPMs are used in the same manner as the original concept for PMTs and APDs published in [5, 6].

SUMMARY

In an embodiment, the present invention provides an SiPM sensor chip with a plurality of pixels. The SiPM sensor chip includes a photodiode; a quench resistor; and a current divider configured to divide the photocurrent of the photodiodes into two currents of equal size. The plurality of pixels are arranged on a grid on which each pixel has an xy position in rows along an x direction and y direction. The SiPM sensor chip has N rows in the x direction xn=x1, x2, x3, . . . xN, where n=1, 2, . . . N, and M rows in the y direction ym=y1, y2, y3 . . . yM, where m=1, 2, . . . M, wherein x encodes for a horizontal direction h and y encodes for a vertical direction v. The current divider Sq,nm or Snm lead to networks NS,h,n and NS,V,m, each of which leads to additional current dividers Sh,n and Sv m having coding resistors Rh,A,n and Rh,B,n, and Rv,c,m and Rv D m, which are linearly coded and which lead to output channels A, B, C, D, with these sensor features being integrated into the sensor chip. The networks Ns,h,n and/or NSiVlm each lead to a summation network Oh and/or Ov, in which the signals of the networks Ns,h,n and/or NS,v,m are merged via summation resistors Rs,h,n and Rs,v,m, respectively, and lead to the output channels E and/or F.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
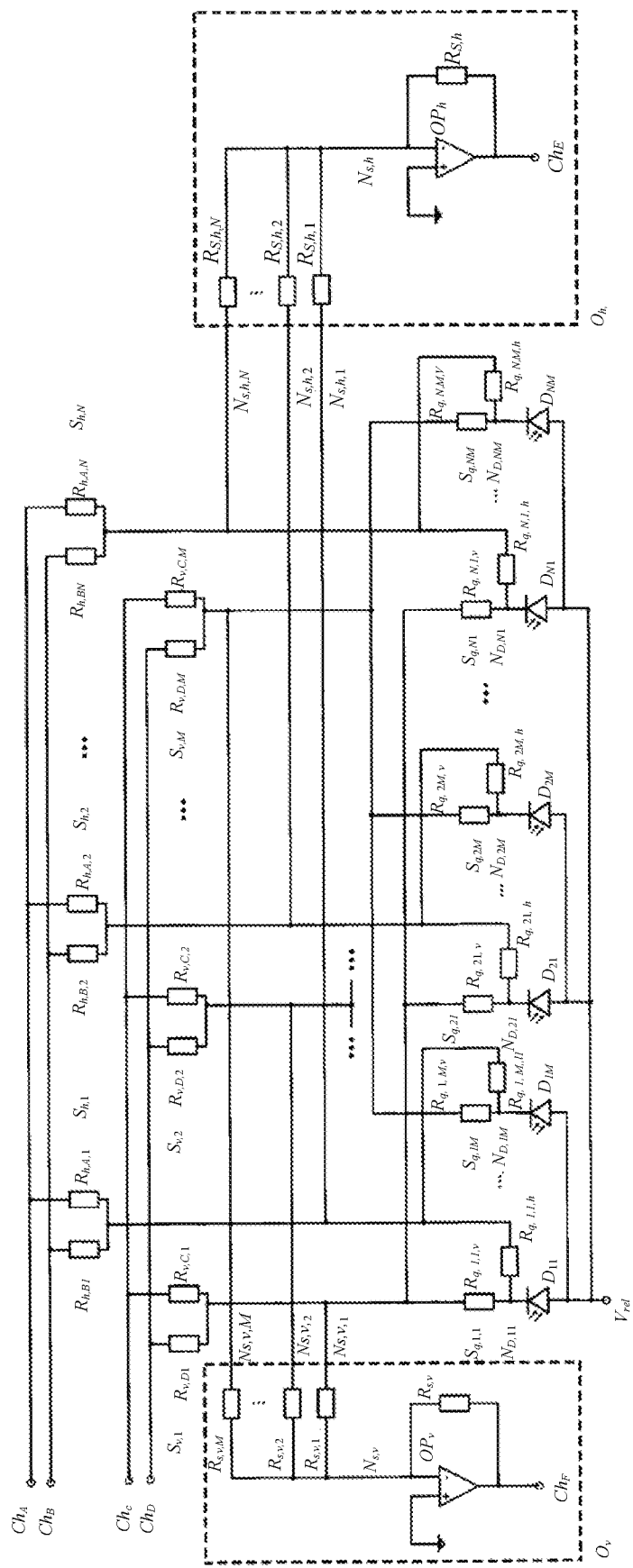
FIG. 1 depicts a sensor chip according to an embodiment of the invention.

Embodiments of the invention provide sensor chips that overcome certain drawbacks of the prior art and with which the parallax error in the determination of an LOR can be reduced. Such sensor chips enable the use of scintillation monocrystals for the detection of signals in positron-emission topography, with it being possible for the DOI problem to be avoided by reducing the parallax error during the determination of the LOR.

Embodiments of the invention improve the sensitivity and the resolution of the sensor chip. Moreover, sensor chips according to embodiments of the invention are suitable for operation together with an MRT, particularly with strong magnetic fields. The accuracy of small-sized PET rings and/or in PET rings that lie closely against the object of study is to be improved. The space requirement of the electronics associated with the measuring arrangement can be reduced. The costs of the device can also be reduced. Sensor chips according to embodiments of the invention are not limited in their applicability to the use in PET; instead, it is possible for them to be used generally for scintillation monocrystals.

With a sensor chip according to an embodiment of the invention, it is possible to reduce parallax errors in the determination of LORs, particularly in scintillation monocrystals. The sensitivity and the resolution of the measuring method and the device are improved. The use of scintillation monocrystals that are longer in the z direction is to be made possible. The detector can be operated together with an MRT device. Particularly in small devices, or if the PET ring lies closely against the object of study, the parallax error is reduced. Space is saved for the associated electronics, thus reducing costs. The sensor chip according to the embodiment of the invention achieves a very high level of detail accuracy. After all, the number of scans of the light distribution function is thus increased significantly, since scanning is even possible at the microcell level. As a result, the graininess increases by a factor of up to 160 or greater compared to conventional SiPMs, photomultipliers, and avalanche diodes, with the factor being dependent on the methods of implementation (to be described later on). This results in a more accurate determination of the second-order moment.

According to an embodiment of the invention, a detector concept for PET measurements is made available in which each individual detector has a scintillation monocrystal and at least one sensor chip that is positioned on one side of the scintillation crystal. Preferably, the sensor chip is mounted on the xy plane of the scintillation monocrystal, especially preferably on the side of the scintillation monocrystal that faces away from the center of the detector ring. In another embodiment, the sensor chip can be mounted on a side of the scintillation monocrystal that is not located on the xy plane, such as on the xz or yz plane, for example. However, this has the disadvantage that, for sensor chips that are mounted on the xz or yz plane, losses of scanner sensitivity are incurred. If the sensor is on the side facing toward the center, additional Compton effects occur.

It is also possible for a plurality of scintillation monocrystals to be coupled with a sensor chip.

The use of the scintillation monocrystal offers the advantage that the sensitivity of the monocrystal can be maximized compared to pixelated scintillation crystals. In the case of pixelated scintillation crystals, the efficiency of the scintillation monocrystals is substantially reduced, for example to only 71% or 59% at 0.8 mm×0.8 mm or 0.5 mm×0.5 mm crystal pixel size of a pixelated crystal array.

Without constituting a limitation, the scintillation monocrystal can be composed of LSO, LYSO, BGO, GSO, $BaF_2$, or NaI:TI (thallium-doped sodium iodide). The materials are known to those skilled in the art.

The ratio of the z component of the scintillation monocrystal to the extension thereof in the x direction of less than or equal to 1 yields good results with a square cross section for xy. The best results are obtained with a ratio of 0.25. Optionally, the ratio can also be smaller. The length of the scintillation monocrystal that is achieved in this way is determined rather by practical circumstances, such as by the diameter of the PET ring or the costs associated with large monocrystals. The dimensioning of the scintillation monocrystal in the z direction depends on the desired sensitivity that is to be achieved. The achieving of the large extension of the scintillation monocrystal in the z direction is a result of the inventive configuration of the sensor chip described in the following, which enables dimensioning that is such that DOI errors are minimized.

According to an embodiment of the invention, the sensor chip is an SiPM and is composed of SiPM microcells.

A sensor chip or a plurality of small sensor chips can be mounted on a scintillation monocrystal that are placed together to form a larger sensor chip.

These can be glued to the scintillation monocrystal. In the event that a plurality of small sensor chips are grouped together, these are regarded as a single sensor chip in terms of the invention if they are mounted on only one side of the scintillation monocrystal. The adhesive used for this purpose should be translucent. Moreover, a layer of a light diffuser can be located between the scintillation monocrystal and the sensor chip if the light intensity is excessively bundled.

An arrangement is also possible in which more than one sensor chip is mounted on the monocrystal. For example, there can be a stack along the z axis in which sensor chips and scintillation monocrystals alternate. This is expedient particularly if scintillation monocrystals are used in which the light distribution cannot be distinguished so starkly in certain crystal regions and a subdivision of the scintillation monocrystal into a plurality of layers, each with one sensor, is sensible.

In another embodiment, sensor chips can also be mounted on the sides of the scintillation monocrystal that do not lie on the xy plane of the scintillation monocrystal. One, two, or more—for example, 3—sensor chips can be mounted on different sides. Sensor chips can be mounted on two opposing sides of the scintillation monocrystal or on adjoining sides of the scintillation monocrystal that lie in the xz or yz direction. Any subcombination is conceivable. The variant in which sensor chips are mounted on opposing sides has the advantage that the accuracy is enhanced when a measurement signal is received. However, the inventive embodiment of the method and of the device engenders precisely the advantage that the signals only need to be read out on one side of the scintillation monocrystal. This corresponds to an embodiment with a single sensor chip. The method and device according to the invention are thus also rendered cost-effective.

According to an embodiment of the invention, the sensor chip is composed of a plurality of pixels that are characterized in that a specific xy position is associated with each pixel. A pixel is composed of at least one photodiode, quench resistors, and a current divider that divides the photocurrent generated by the diodes into two equal parts.

Instead of a quench resistor, the quenching process can also be initiated by active quenching using methods known to those skilled in the art, such as through the use of a transistor, for example. In the following description, a quench resistor $R_q$ is disclosed in the disclosed embodiments. However, it is also possible in all embodiments to use a different, equivalent means for quenching—a transistor, for example—, so that the disclosure is not limited to the use of a quench resistor.

The pixels are arranged on a grid in which the pixels are arranged in rows in the x direction and in the y direction. The pixels in rows and columns are preferably arranged so as to be parallel to the x axis and the y axis. Typically, 10, 100, or 1000 pixels are arranged in the x direction and the y direction, respectively. The arrangement then contains N rows in the x direction $x_n=x_1\ x_2,\ x_3\ \ldots\ x_N$, where n=1, 2, ... N and M rows in the y direction $y_m=y_1, y_2, y_3 \ldots y_M$, where m=1, 2, ... M. The directions x and y are preferably arranged so as to be orthogonal to one another, but they can also be arranged at an angle that is different from 90°, resulting in a diamond pattern.

This arrangement forms a block. A sensor chip can have a plurality of blocks that are arranged on a grid.

In an embodiment, a pixel consists of a single SiPM microcell that is composed of a photodiode with 2 quench resistors that form a current divider together. The term "SiPM microcell" is referred to hereinafter as a "microcell."

This arrangement results in a very high level of detail accuracy. Through the arrangement of 100×100 or 1000×1000 in a single SiPM, the second-order moment is determined during the integration into the microcell array from 100 or 200 and 1000 to 2000 scanning points of the light distribution. Typical PS-PMTs or arrays of SiPMs have a level of detail accuracy of 10 to 20 in each spatial direction. With the novel sensor chip, the number of scans of the light distribution function is increased by a factor of 5 or more in comparison to non-chip-implemented SiPMs or photomultipliers or avalanche diodes, which results in improved determination of the second-order moment with the sensor chips according to the invention, since each microcell has an individual position coding and yields a signal that is supplied for analysis.

The position of a microcell on this grid is then characterized by $x_n y_m$ on the xy plane, since every pixel contains only one microcell.

In each one of these positions is located a microcell consisting of the photodiode $D_{nm}$, which has an output network $N_{D,n\ m}$, downstream of which a current divider $S_{q,nm}$ is connected that has two quench resistors $R_{q,nm,h}$ and $R_{q,nm,v}$ in which the index v designates the y direction and the index h designates the x direction, and with the photodiode being connected to a supply voltage $V_{ref}$. The quench resistors are of equal size and are in a range from 1 megaohm to 100 megaohm. The reference voltage $V_{ref}$ can lie between −20 V and −40 V, depending on the manufacturing technology. In the terms $D_{nm}$, $R_{q,nm,h}$, or $R_{q,nm,v}$, n indicates the position of the photodiodes and the quench resistors along the x axis and m the position along the y axis. $N_{D,nm}$ denotes the lines connecting the photodiode to the current divider $S_{q\ nm}$, which is arranged downstream from the photodiode.

The networks $N_{s,v,m}$ and $N_{s,h,n}$ connected to the quench resistors $R_{q,nm,h}$ and $R_{q,nm,v}$, in which networks $N_{s,v,m}$ and $N_{s,h,n}$ the index v denotes the y direction and the index h, in turn, denotes the x direction, lead to additional current dividers $S_{h,n}$ and $S_{v,m}$, which have the coding resistors $R_{h,A,n}$ and $R_{h,B,n}$, and $R_{v,C,m}$ and $R_{v,D,m}$, respectively, which lead to the output channels A, B, C, and D. According to the continuous coordinates $x_n y_m$ for a row in the x direction and a row in the y direction, the coding resistors $R_{h,A,n}$ and $R_{h,B,n}$ and $R_{v,C,m}$ and $R_{v,D,m}$ have different coding resistor values for a respective coordinate xy that enable position encoding with respect to the xy coordinates for a respective row x or a row y. For example, the coding resistors $R_{h,A,n}$ and $R_{h,B,n}$ and $R_{v,C,m}$ and $R_{v,D,m}$ can thus assume continuous values within an x row with progressive positions $x_n y_1, x_n y_2, x_n y_3 \ldots x_n y_M$, and within a y row with progressive positions $x_1 y_m, x_2 y_m \ldots x_n y_m$ for the junctions to the output channels A and B, and C and D, which makes position coding possible. The coding resistors have resistance values that are usually in the range between 10Ω and 1 kΩ. The exact position of the detected light is given by the active microcell. The active microcells with the coordinates xy can be determined using the formula (A−B)/(A+B) and (C−B)/(C+B). The principle is known as Anger logic.

For the position coding, the coding resistor values are encoded linearly, with the coding resistors that encode the x direction being connected to the output channel A and B, changing inversely to one another linearly in an ascending and descending manner. This means that channel A can be encoded so as to increase linearly and channel B so as to decrease linearly, or vice versa. The same applies to the y direction, which is encoded with channel C and D. As a result, the generated photocurrent of each microcell is apportioned individually to the readout channels as a function of the position.

The coding resistor values $R_{h,A,1}$ and $R_{h,B,n}$, $R_{h,A,2}$ and $R_{h,B,n-1}$, $R_{h,A,3}$ and $R_{h,B,2}$ ... $R_{h,A,n}$ and $R_{h,B,1}$, as well as $R_{v,C,1}$ and $R_{v,D,n}$, $R_{v,C,2}$ and $R_{v,D,n-1}$, $R_{v,C,3}$ and $R_{v,D,n-2}$ ... $R_{v,C,n}$ and $R_{v,D,1}$ determine not only the photocurrent distribution, which is important for the position coding, but, at the same time, they are selected according to the invention such that the voltage that is required for the summation network described below is set that is required for the calculation of the depth information for the position of the scintillation. The coding resistors are to be implemented as precisely as possible in the chip in order to achieve maximally precise linear coding.

In an embodiment, a pixel is composed of at least one photodiode $D_{nm,k}$, each with its own quench resistor $R_{q,nm,k}$, where k=1, 2, 3, ... K, and a current divider $S_{nm}$ consisting of the resistors $R_{nm,v}$ and $R_{nm,h}$. The resistors $R_{nm,v}$ and $R_{nm,h}$ are of equal size and lie in the range from 1 kΩ to 100 kΩ. Typically, K lies in the range from 1 to 100. In this embodiment, a microcell is composed of a photodiode $D_{nm,k}$ with its own respective quench resistor $R_{q,nm,k}$. The quench resistors $R_{q,nm,k}$ are all of equal size and lie in the range from 1 megaohm to 100 megaohm. The generated photocurrent of the photodiodes $D_{nm,k}$ is merged via the quench resistors $R_{q,nm,k}$ and the network $N_{I,nm}$. The total generated photocurrent of the cluster of microcells created in this way, each consisting of the photodiodes $D_{nm,k}$ and the quench resistors $R_{q,nm,k}$, is fed to a common current divider $S_{nm}$. The current divider $S_{nm}$ divides the total current into equal shares for x and y encoding, which, as described above, leads via additional current dividers $S_{h,n}$ and $S_{v,m}$, respectively, to the output channels A and B, and C and D.

For example, 10 microcells can be grouped together in this cluster in each direction x and y. This value shall not be understood as being limitative; rather, 20, 50, or 100 microcells can also be grouped together, depending on what the process technology permits. Signals can thus be forwarded from at least two microcells from an x direction or a y direction as a single, merged signal. This embodiment has the advantage that a strong photocurrent per pixel can be obtained. However, the first embodiment is preferred in order to obtain maximum resolution and/or graininess. Both embodiments for the pixels can be implemented in a sensor chip.

For each row x and/or y of pixels of the two embodiments, the potentials on the networks $N_{s,h,1}$, $N_{s,h,2}$ ... $N_{s,h,N}$ and $N_{s,v,1}$, $N_{s,v,2}$ ... $N_{S,V,M}$ are tapped via the summation resistors $R_{S,h,n}$ and $R_{S,v,m}$, respectively, and fed to a summation network with the output channels E and F. At the same time, embodiments are possible in which either the networks $N_{S,h,1}$, $N_{S,h,2}$, ... $N_{S,h,N}$ for the x direction or the networks $N_{S,v,1}$, $N_{S,v,2}$, ... $N_{S,V,M}$ for the y direction are connected to a summation network $O_h$ or $O_v$ or, preferably, the networks $N_{S,h,n}$ for the x direction and $N_{S,v,m}$ for the y direction are connected in summation networks $O_h$ or $O_v$ to the output channels E and F. The resistance values for the summation resistors $R_{S,h,n}$ and $R_{S,v,m}$ are each of equal size in a summation network Oh and Ov, respectively. The summation resistance values can lie between 1 k$\Omega$ and 100 k$\Omega$. The summation resistors $R_{S,h,n}$ and $R_{S,v,m}$ must be great enough that the generated photocurrent is not substantially influenced by the SiPM diodes but small enough in order to not influence the quenching behavior of the microcells. The summation resistors $R_{S,h,n}$ and $R_{S,v,m}$ are merged via the network $N_{Sh}$ and $N_{S,v}$, respectively. The signals are thus added together.

The summation networks $O_h$ and/or $O_v$ can contain an operational amplifier $OP_h$ or OP that is grounded and has a negative feedback with a resistor $R_{S,h}$ or $R_{S,v}$. The amplification of the signal of the output channels E and F can be adjusted via the ratio of $R_{S,h}/R_{S,h,n}$ or $R_{S,v}/R_{S,v,m}$. The summation networks $O_h$ and/or $O_v$ can be integrated into the sensor chip, or respective portions thereof can be less preferably located outside of the sensor chip.

If the entire summation network $O_h$ and/or $O_v$ is located outside of the sensor chip, then this has the consequence that all networks $N_{S,h,n}$ and/or $N_{Sv,m}$ are led out of the sensor chip, which results in a very large number of output channels. If the summation resistors $R_{Sh,n}$ and/or $R_{S,v,m}$ are integrated into the sensor chip, only the networks $N_{S,h}$ and/or $N_{S,v}$ have to be led out of the sensor chip, which can be achieved with one output channel.

For reasons that involve saving space and reducing noise influences, however, it is preferred for the complete summation network $O_h$ and/or $O_v$ to be integrated into the chip.

The potentials on the networks $N_{S,h,n}$ and $N_{S,v,m}$ should each be distributed quadratically as precisely as possible. This is necessary in order to obtain the second-order moment. It is possible in this regard to enable quadratic voltage coding of the networks using voltage dividers and additional resistors without these additional resistors altering the photocurrent distribution. In order to achieve maximally space-saving chip integration, it is recommended that no additional resistors be used, but rather that the coding resistors also be selected for the voltage adjustment. Together with the coding resistors $R_{h,A,1}$ and $R_{h,B,1}$ ... $R_{h,A,N}$ and $R_{h,B,N}$ or $R_{v,C,1}$ and $R_{VD,1}$ ... $R_{V,C,m}$ and $R_{V,D,M}$, the resistors of the current divider $S_{q\ nm}$ in the first embodiment and $S_{nm}$ in the second embodiment form a voltage divider. Since the coding resistors $R_{h,A,n}$ and $R_{h,B,n}$ and $R_{v,c,m}$ and $R_{v,D,m}$, respectively, constitute a current divider, the total resistance of a current divider is calculated according to the formula $(R_{h,A,n}*R_{h,B,n})/(R_{h,A,n}+R_{h,B,n})$ and $(R_{v,C,m}*R_{v,D,m})/(R_{v,c,m}+R_{v,D,m})$, respectively. If the coding resistors, which are usually in the range from 10$\Omega$ to 1 k$\Omega$, are selected so as to ascend and descend in linear opposition for output channel A and B, and C and D, a quadratic total resistance value of the current divider $S_{h,n}$ and $S_{v\ m}$, respectively, and hence the required quadratic potential distribution on the networks $N_{S,v,m}$ and/or $N_{S,h,n}$, is automatically reached. At the same time, the linear coding for the photocurrent is given. It is important in this regard that the coding resistors of the two respective readout channels ascend and descend linearly and the maximum and minimum values—that is, the initial and final values of the linear progression in each direction—are selected so as to be equal. Expressed mathematically, the following must hold: $R_{h,A,n}=R_{min}+(n-1)*R_{stepi}$ $R_{h,B,n}-R_{max}-(n-1)*R_{stepi}$, $R_{h,A,N}-R_{max}$ and $R_{h,B,N}-R_{min}$, and $R_{v,C,m}=R_{min}+(m-1)*R_{stepi}$ $R_{v,D,m}-R_{max}$ $(m\_1)*R_{stepi}$ $R_{v,C,M}$ $R_{max}$ and $R_{V.D.M}=R_{min}$.

The potentials $\phi(N_{S,h,n})$ and $\phi(N_{S,v,m})$ on the networks $N_{S,h,n}$ and $N_{S,v,m}$, respectively, can also deviate from an exactly quadratic coding as a result of corresponding additional resistors or of modified coding resistors. For the resulting potential coding, $(\phi^{2n})^k$ must apply, where n=1, 2, 3 ... and 0.5<k<1.5.

According to embodiments of the invention, described functions are integrated at least partially but preferably completely into the sensor chip. Semiconductor process techniques that are known to those skilled in the art, such as the C-MOS process or special SiPM manufacturing methods like RGB-SiPM, RSB-HD-SiPM, or NUV-SiPM, for example, can be used for this purpose. In particular, the integration of the summation network $O_v$ and $O_h$, respectively, into the sensor chip offers the advantage that, in addition to the space savings, signal interference is minimized and the signal-to-noise ratio is optimized.

The sensor chips according to embodiments of the invention can be arranged to form a block a×b on a grid. The linear position codings and quadratic coding of the potentials extend across sensors over a plurality of sensor chips in the directions a and b.

Likewise, it is possible to subdivide a single sensor chip into J blocks of any xy size, where j=here, the position coding, potential coding, and the summation network each extend over only one single block of the sensor chip. A block is constructed in exactly the same manner as a sensor chip, which is illustrated in FIG. 1. In the embodiment with J blocks, the sensor chip contains output channels $A_j$, $B_j$, $C_j$, and $D_j$, as well as $E_j$ and/or $F_j$, for each block j. This embodiment has the advantage that a plurality of blocks can be integrated into a sensor chip without non-photosensitive interspaces occurring between the blocks.

FIG. 1 shows the components of a sensor chip according to an embodiment of the invention. Photodiodes $D_{11}$ ... $D_{1M}$, $D_{21}$ ... $D_{2M}$ ... $D_{N1}$ ... $D_{NM}$ are shown which are connected to a reference voltage $V_{ref}$. Branching off from the photodiodes $D_{11}$ ... $D_{1M}$, $D_{21}$ ... $D_{2M}$ ... $D_{N1}$ ... $D_{NM}$ via output networks $N_{D,nm}$ are current dividers $S_{q\ nm}$ with quench resistors $R_{q,11,h}$ and $R_{q,11,v}$ ... $R_{q,1M,h}$ and $R_{q,1Mv1}$ $R_{q,21,h}$ and $R_{q,21,h}$ $R_{q,21,h}$ and $R_{q,21,v}$ ... $R_{q,2M,h}$ and $R_{q,2M,v}$ $R_{q,N1,h}$ and $R_{q,N1,v}$ that are connected via the networks $N_{S,h,1}$ ... $N_{S,h,N}$ and $N_{S,v,1}$ ... $N_{S,V,M}$ to additional current dividers $S_{h,nm}$ and $S_{v,nm}$ with the coding resistors $R_{h\ A1}$ and $R_{h,B,1}$ ... $R_{h,A,N}$ and $R_{h,B,N}$, which lead to the output channels A and B, and current dividers $R_{v,c,i}$ and $R_{V,D,I}$ ... $R_{V.C.M}$ and $R_{V,D,M}$, which lead to the output channels C and D. The networks $N_{S,h,1}$ ... $N_{S,h,N}$ and $N_{S,v,1}$ ... $N_{S,V,M}$ are connected at summation resistors $R_{S,h,1}$ ... $R_{S,h,N}$ and $R_{S.v.1}$ ... $R_{S,V,M}$, respectively, to one or two grounded operational amplifiers $OP_h$ and $OP_v$, which have output channels E and F. The operational amplifiers $OP_h$ and OP are coupled with negative feedback via operational amplifier resistors $R_{S,h}$ and $R_{S,v}$. FIG. 1 also shows that additional photodiodes and current dividers, which are indicated by dots, are arranged with quench resistors on a grid on the sensor chip and led through on additional networks $N_{S,h,2}$ and $N_{S,v,2}$, $N_{S,h,3}$ and $N_{S,v,3}$, etc., to the summation networks $O_h$ and $O_v$.

The quench resistors $R_{q,nm,h}$ and $R_{q,nm,v}$, together with the coding resistors $R_{h,A,1}$ and $R_{h,B,1}$ ... $R_{h,A,N}$ and $R_{h,B,N}$, and $R_{v,c,1}$ ... and $R_{v,C,M}$ ... $R_{v,C,M}$ and $R_{v,D,M}$, form a voltage divider, so that, through appropriate selection of the resistors, a quadratically coded potential is achieved on the networks $N_{S,h,1} \ldots N_{S,h,N}$ and $N_{S,v,M} \ldots N_{S,v,M'}$.

Figure 2:
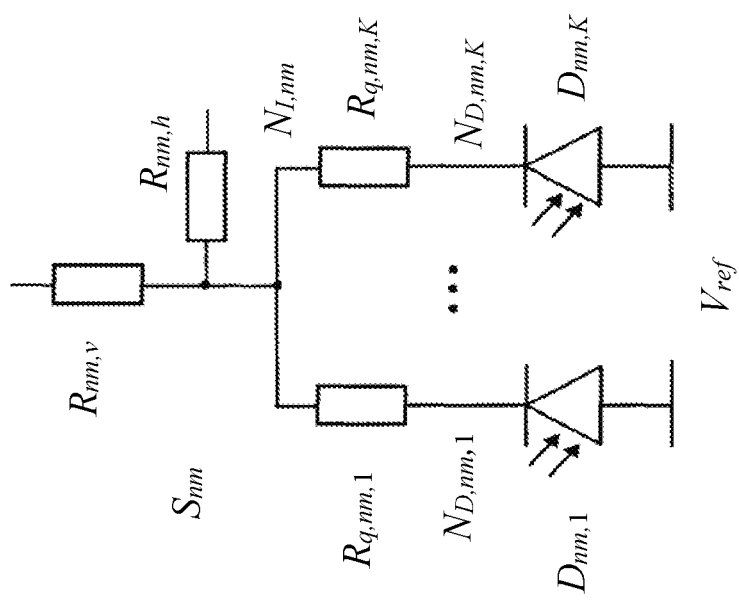
FIG. 2 depicts a pixel of a sensor according to an embodiment of the invention.

FIG. 2 shows a pixel of a sensor chip of a second embodiment. The photodiodes belonging to a pixel have the designation $D_{nm,1} \ldots, D_{nm,K}$. Networks $N_{D,nm,1} \ldots, N_{D,nmK}$ are connected to these photodiodes $D_{nm,1} \ldots D_{nm,K}$ that lead to the respective associated quench resistors $R_{q,nm,1}$. $R_{q,nm,K}$. A network $N_{1nm}$ leads away from the quench resistors $R_{q,nm,1} \ldots, R_{q,nm,K}$ that leads to a current divider $S_{nm}$. In all abbreviations, the index K refers to the number of microcells that are fed to a current divider $S_{nm}$. The current divider $S_{nm}$ contains the resistors $R_{nm,v}$ and $R_{nm,h}$ that lead to the networks $N_{S,v,m}$ and $N_{S,h,n}$ (not shown in the drawing).

Figure 3:
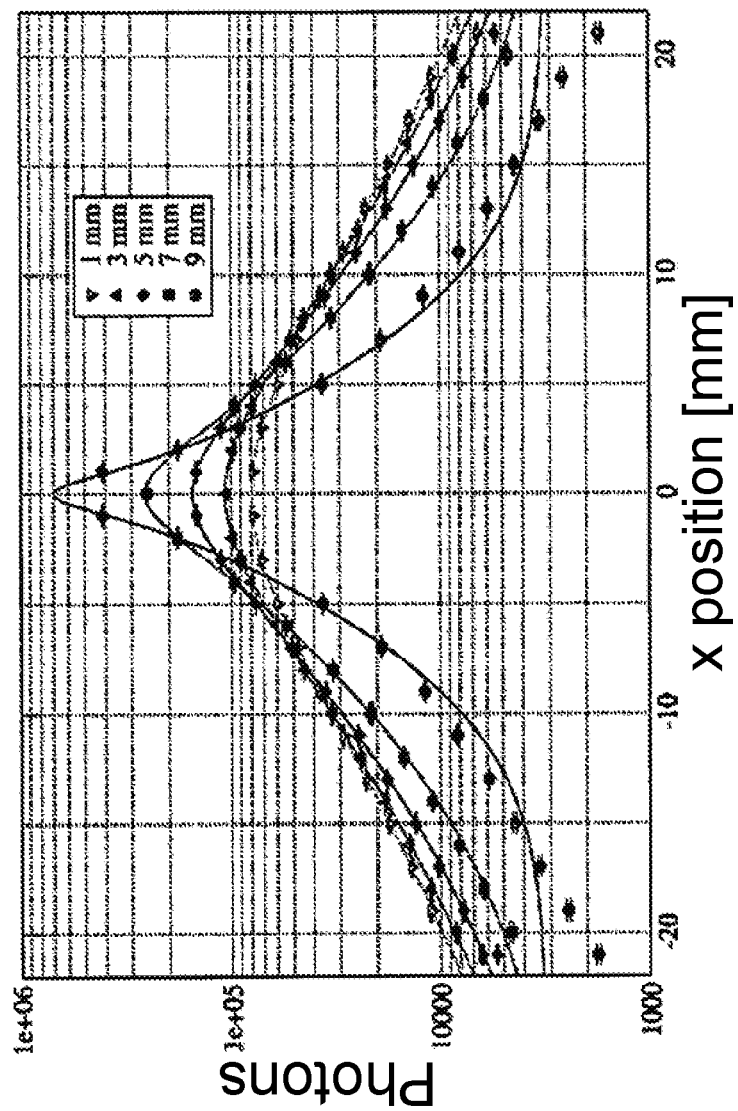
FIG. 3 depicts a representation of the light distribution as a function of the depth of interaction in a monocrystal.

FIG. 3 shows the distribution of the photons of a scintillation process for an x axis standing for any axis due to the rotationally symmetrical distribution in the monocrystal, in which the abscissa describes the light distribution around the position zero [mm]. The ordinate refers to the number of photons as an absolute number.

The curves denoted by the symbols dot, square, diamond, upward-pointing triangle, and downward-pointing triangle represent the light distribution as a function of the depth of penetration of the y quantum into the scintillation crystal.

The symbols correspond to the following depths of penetration of the $\beta^+\beta^-$ annihilation radiation into the scintillation monocrystal:

| | |
|---|---|
| Point: | 9 mm |
| Square: | 7 mm |
| Diamond: | 5 mm |
| Upwardly pointing triangle: | 3 mm |
| Downwardly pointing triangle: | 1 mm |

Figure 4:
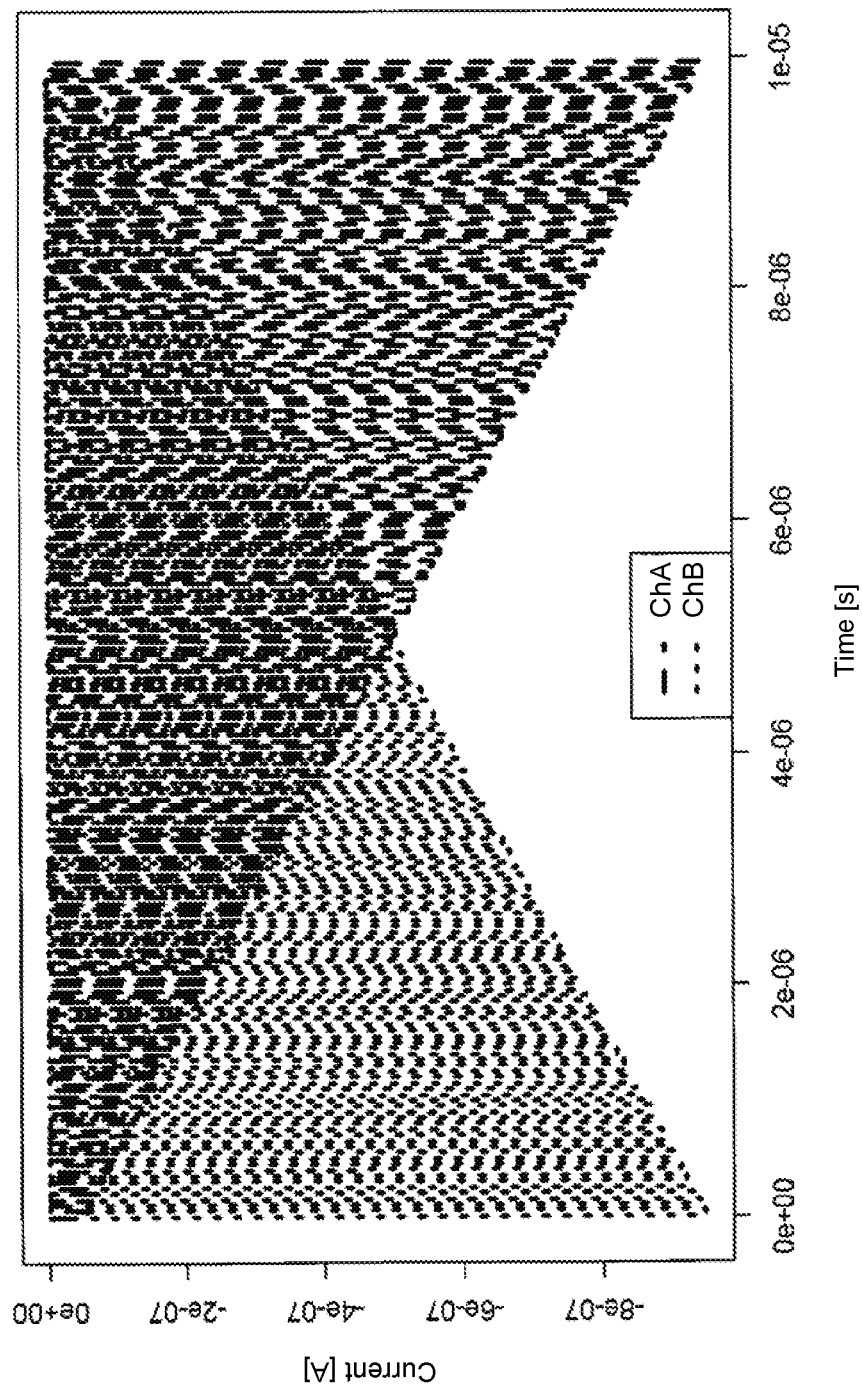
FIG. 4 depicts output signals of position-coded channels.

FIG. 4 shows the output signals of the position-coded channels, representatively shown as channels A and B. The abscissa shows the time in seconds. The ordinate shows the output current of A and B in [A]. In the time sequence from 0 to 10 ps, photodiodes of an x position are each active for 50 ns. After activation of a microcell comes a pause of 50 ns, upon which the next microcell in the x direction is activated. The figure shows the distribution of the photocurrent of a microcell over channels A and B. Since the ratio is different for every x position, the position of every single microcell can be determined by means of the two output channels.

Figure 5:
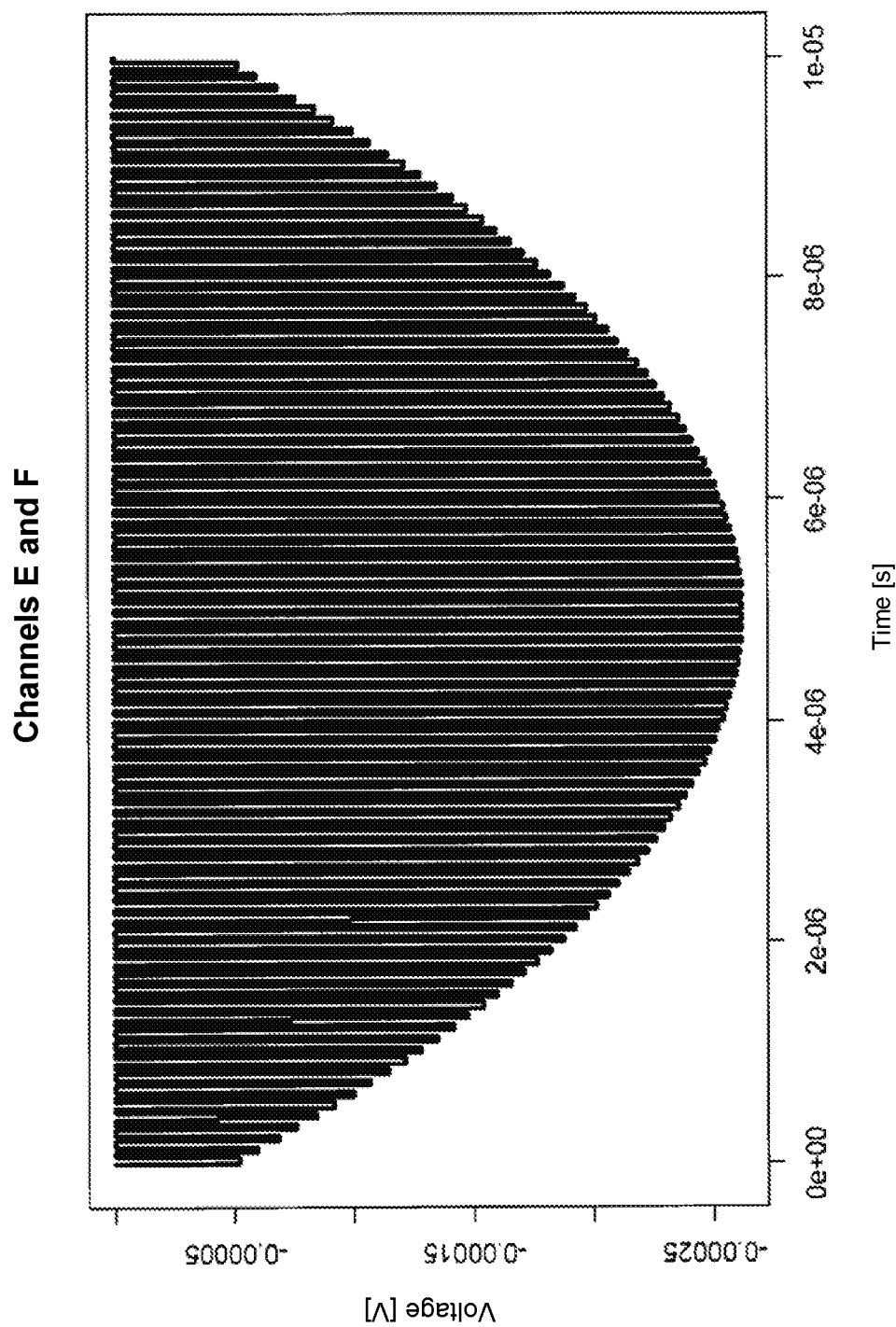
FIG. 5 depicts an output voltage of a summation network.

FIG. 5 shows the output voltage at the operational amplifier of channels E and F. The abscissa shows the time in seconds. The ordinate shows the output voltage of channels E and F in [V]. In the time sequence from 0 to 10 ps, photodiodes of an x and y position, respectively, are each active for 50 ns. After activation of a microcell comes a pause of 50 ns, upon which the next microcell in the x or y direction is activated. The figure shows the quadratic distribution of the voltage as a function of the x and y position of a microcell via channels E and F. An amplification factor of one is set for the summation amplifier by means of the corresponding resistors.

Figure 6:
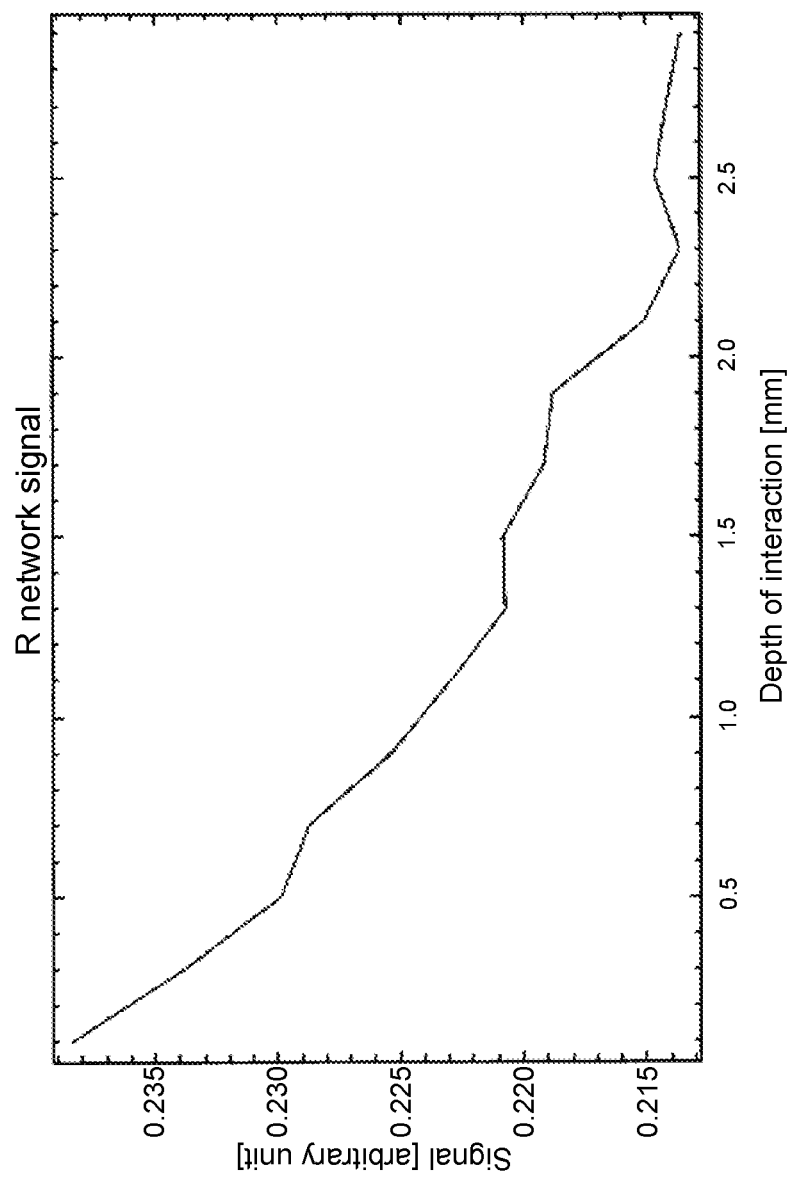
FIG. 6 depicts an output signal of a summation network as a function of the depth of interaction.

FIG. 6 shows the output signal of the summation network as a function of the depth of interaction at the xy center of the scintillation monocrystal. The abscissa shows the depth of interaction in [mm]. The ordinate shows the output signal of the summation network in an arbitrary unit. The depth of interaction at the xy center of the crystal can be determined with the aid of the network signal, since the first moment is equal to zero, so the depth of interaction can be determined exclusively by means of the second moment.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

CITED PRIOR ART

[1]: Gola, A., et al., "A novel approach to position-sensitive silicon photomultipliers: First results."
[2]: Schulz, V., et al., "Sensitivity encoded silicon photomultiplier-a new sensor for high-resolution PET-MRI." Physics in Medicine and Biology 58.14 (2013): 4733.
[3]: Fischer, P., Piemonte, C., "Interpolating silicon photomultipliers," NIMPRA, November 2012.
[4]: Espana, S., et al., "DigiPET: sub-millimeter spatial resolution small-animal PET imaging using thin monolithic scintillators."
[5]: Lerche, Ch. W., et al., "Depth of interaction detection for y-ray imaging."
[6]: U.S. Pat. No. 7,476,864 (B2).
[7]: Ito, M., et al., "Positron Emission Tomography (PET) detectors with Depth-of-Interaction (DOI) capability."
[8]: Judenhofer, M. S., et al., "Simultaneous PET-MRI: A new approach for functional and morphological imaging."
[9]: Ziegler, S. I., et al., "A prototype high-resolution animal positron tomograph with avalanche photodiode arrays and LSO crystals."
[10]: Balcerzyk, M., et al., "Preliminary performance evaluation of a high resolution small animal PET scanner with monolithic crystals and depth-of-interaction encoding."
[11]: Balcerzyk, M., et al., "Initial performance evaluation of a high-resolution Albira small animal positron emission tomography Scanner with monolithic crystals and depth-of-interaction encoding from a user's perspective."
[12]: González Martinez, A. J., et al., "Innovative PET detector concept based on SiPMs and continuous crystals."
[13]: Siegel, S., et al., "Simple charge division readouts for imaging scintillator arrays using a multi-channel PMT."
[14]: McElroy, D. P., et al., "First results from MADPET-II: A novel detector and readout system for high-resolution small-animal PET."

[15]: Berneking, A., "Characterization of sensitivity-encoded silicon photomultiplier for high-resolution simultaneous PET/MR imaging," diploma thesis, RWTH Aachen University, 3 Dec. 2012.

The invention claimed is:

1. An SiPM sensor chip with a plurality of pixels, comprising:
a photodiode;
a quench resistor; and
a current divider configured to divide the photocurrent of the photodiodes into two currents of equal size,
wherein the plurality of pixels are arranged on a grid on which each pixel has an xy position in rows along an x direction and y direction,
wherein the SiPM sensor chip has N rows in the x direction $x_n$, $x_1$, $x_2$, $x_3$, ... $x_N$, where n=1, 2, ... N, and M rows in the y direction $y_m = y_1$, $y_2$, $y_3$, ... $y_M$, where m=1, 2, ... M, wherein x encodes for a horizontal direction h and y encodes for a vertical direction v,
wherein the current divider $S_{q,nm}$ or $S_{nm}$ lead to networks $N_{S,h,n}$ and $N_{S,v,m}$, each of which leads to additional current dividers $S_{h,n}$ and $S_{v\ m}$ having coding resistors $R_{h,A,n}$ and $R_{h,B,n}$, and $R_{v,c,m}$ and $R_{v\ Dm}$, which are linearly coded and which lead to output channels A, B, C, D, with these sensor features being integrated into the sensor chip, and
wherein the networks $N_{s,h,n}$ and/or $N_{SiV1m}$ each lead to a summation network $O_h$ and/or $O_v$, in which the signals of the networks $N_{s,h,n}$ and/or $N_{S,v,m}$ are merged via summation resistors $R_{s,h,n}$ and $R_{s,v,m}$, respectively, and lead to the output channels E and/or F.

2. The SiPM sensor chip as set forth in claim 1, wherein the summation network $O_h$ and/or $O_v$ each contain an operational amplifier $OP_h$ or $OP_v$ that has a negative feedback via operational amplifier resistors $R_{S,h}$ and $R_{S,v}$.

3. The SiPM sensor chip as set forth in claim 1, wherein the summation resistors $R_{S,h,n}$ and/or $R_{S,v,m}$ are integrated into the SiPM sensor chip.

4. The SiPM sensor chip as set forth in claim 3, wherein the summation networks $O_h$ and/or $O_v$ are integrated into the SiPM sensor chip.

5. The SiPM sensor chip as set forth in claim 1, wherein a pixel comprises a photodiode $D_{nm}$ with a current divider $S_{q\ nm}$ with two quench resistors $R_{q,nm,h}$ and $R_{q,nm,v}$.

6. The SiPM sensor chip as set forth in claim 1, wherein a pixel comprises at least one photodiode $D_{nm,k}$, each with its own quench resistors $R_{q,nm,k}$, where k=1, 2, 3, ... K, and a network NI,nm, which leads to a current divider $S_{nm}$, that is composed of the resistors $R_{nm,v}$ and $R_{nm,h}$.

7. The SiPM sensor chip as set forth in claim 1, comprising a pixel comprising a photodiode $D_{nm}$ with a current divider $S_{q,nm}$ with two quench resistors $R_{q,nm}$ and $R_{q,nm,v}$ and a pixel comprising at least one photodiode $D_{nm,k}$, each with its own quench resistors $R_{q,nm,k}$, where k=1, 2, 3, ... K, and a network NI,nm, which leads to a current divider $S_{nm}$ that is composed of the resistors $R_{nm,v}$ and $R_{nm,h}$.

8. The SiPM sensor chip as set forth in claim 1, wherein the coding resistor values of the coding resistors $R_{h,A,n}$ and $R_{h,B,n}$, which encode the x direction and are connected to the output channels A and B, are encoded linearly so as to ascend and descend counter to one another, and the coding resistor values of the coding resistors $R_{v,c,m}$ and $R_{v,D,m}$, which encode in the y direction and are connected to the output channels C and D, are encoded linearly so as to ascend and descend counter to one another.

9. The SiPM sensor chip as set forth in claim 1, wherein the potentials on the networks $N_{S,h,n}$ and/or $N_{S,v,m}$ are quadratically encoded.

10. SiPM sensor chips as set forth in claim 9, wherein a plurality of sensor chips are arranged on a grid to form a block a×b, with the linear position coding and the quadratic coding of the potentials extending across sensors over a plurality of sensor chips in the directions a and b.

11. The SiPM sensor chip as set forth in claim 1, wherein the pixels are arranged in rows in the x direction and rows in the y direction, with the rows x and y being inclined in relation to one another at an angle of <90°, resulting in a diamond pattern.

12. The SiPM sensor chip as set forth in claim 1, wherein the sensor chip has a plurality of J blocks, with blocks j=1 ... J, each of which is embodied as set forth in any one of claims 1 to 11, and the sensor chip has its own output channels Aj, Bj, Cj, and Dj, as well as Ej and/or Fj, for each block j.

* * * * *